(12) United States Patent
Park et al.

(10) Patent No.: US 7,759,667 B2
(45) Date of Patent: Jul. 20, 2010

(54) PHASE CHANGE MEMORY DEVICE INCLUDING RESISTANT MATERIAL

(75) Inventors: Young-Lim Park, Anyang-si (KR);
Sung-Lae Cho, Yongin-si (KR);
Byoung-Jae Bae, Hwaseong-si (KR);
Jin-il Lee, Seongnam-si (KR);
Hye-Young Park, Seongnam-si (KR);
Ji-Eun Lim, Yongin-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 384 days.

(21) Appl. No.: 11/762,801

(22) Filed: Jun. 14, 2007

(65) Prior Publication Data

US 2008/0142777 A1 Jun. 19, 2008

(30) Foreign Application Priority Data

Dec. 13, 2006 (KR) ...................... 10-2006-0126832

(51) Int. Cl.
*H01L 29/04* (2006.01)
(52) U.S. Cl. .................................. 257/3; 257/E45.002
(58) Field of Classification Search .................... 257/1, 257/2, 3, E45.001, E45.002; 365/148
See application file for complete search history.

(56) References Cited

U.S. PATENT DOCUMENTS

| 7,012,273 B2 | 3/2006 | Chen | |
|---|---|---|---|
| 2005/0167645 A1* | 8/2005 | Kim et al. | 257/2 |
| 2007/0108429 A1* | 5/2007 | Lung | 257/2 |

FOREIGN PATENT DOCUMENTS

| KR | 1020040054250 A | 6/2004 |
|---|---|---|
| KR | 1020050059400 A | 6/2005 |
| KR | 1020050059855 A | 6/2005 |
| KR | 1020060001055 A | 1/2006 |
| KR | 1020060001089 A | 1/2006 |

* cited by examiner

*Primary Examiner*—Jerome Jackson, Jr.
*Assistant Examiner*—Paul A Budd
(74) *Attorney, Agent, or Firm*—Volentine & Whitt, PLLC

(57) ABSTRACT

A phase change memory device includes a lower electrode provided on a substrate, an interlayer insulating layer including a contact hole exposing the lower electrode, and covering the substrate, a resistant material pattern filling the contact hole, a phase change pattern interposed between the resistant material pattern and the interlayer insulating layer, and extending between the resistant material pattern and the lower electrode, wherein the resistant material pattern has a higher resistance than the phase change pattern, and an upper electrode in contact with the phase change pattern, the upper electrode being electrically connected to the lower electrode through the phase change pattern.

9 Claims, 15 Drawing Sheets

PHASE CHANGE MEMORY DEVICE INCLUDING RESISTANT MATERIAL

CROSS-REFERENCE TO RELATED APPLICATION

This application claims the benefit of Korean Patent Application No. 10-2006-0126832, filed Dec. 13, 2006, the contents of which are hereby incorporated herein by reference in their entirety.

BACKGROUND OF THE INVENTION

1. Field of the Invention

The present disclosure relates to a semiconductor device and, more particularly, to a phase change memory device including resistant material and a method of fabricating the same.

2. Description of the Related Art

A semiconductor memory device may be classified as a volatile memory device or a non-volatile memory device depending on whether data stored in the memory device is erased when power to the device is turned off. Generally, a non-volatile memory device maintains data stored therein even when power is turned off. Accordingly, a non-volatile memory device is generally employed in applications that require the memory device to maintain stored data even during the event of a power loss. These applications may include, for example, a mobile memory device.

With the growing need for memory devices that are smaller in size but have large data storage capabilities, there is a high demand for highly integrated memory devices. As is well known, memory devices use memory cells to store data. Most memory cells are made of transistors that are turned on or off to store data. Alternatively, the memory cells may include phase change material.

A unit cell of the phase change memory device includes an access device and a data storage element serially connected to the access device. The data storage element includes a lower electrode electrically connected to the access device and a phase change material layer in contact with the lower electrode. Specifically, the phase change material layer is a material layer that electrically switches between an amorphous state and a crystalline state. The resistivity of the phase change material changes as the phase change material transitions from an amorphous state to a crystalline state and vice versa. The physical state of the phase change material may denote the type of data stored in the phase change memory cell. For example, when the phase change material layer is in an amorphous state (i.e., has high resistance); it generally denotes the storage of data '1' in the cell. Alternatively, when the phase change material layer is in a crystalline state, (i.e., low resistance), it generally denotes the storage of data 'O' in the cell. The phase change material may change its state in response to a program current provided to the phase change material.

FIG. 1 is a cross-sectional view of a conventional phase change memory device. Referring to FIG. 1, a typical phase change memory device includes a lower interlayer insulating layer 12 disposed at a predetermined region of a semiconductor substrate 1, a lower electrode 14 passing through the lower interlayer insulating layer 12, an upper interlayer insulating layer 13 covering the surface of the lower interlayer insulating layer 12, a bit line 18 disposed on the upper interlayer insulating layer 13, a phase change pattern 16 disposed in the upper interlayer insulating layer 13 and in contact with the lower electrode 14, and an upper electrode 17 electrically connecting the phase change pattern 16 and the bit line 18. In addition, the lower electrode 14 is electrically connected to an access device such as a diode or a transistor.

When a program current flows through the lower electrode 14, Joule heat is generated at an interface ("an active contact surface") between the phase change pattern 16 and the lower electrode 14. This Joule heat converts a part 20 of the phase change pattern 16 ("transition volume") into an amorphous or crystalline state. A resistivity of the transition volume 20 in the amorphous state is higher than that of the transition volume 20 in the crystalline state. Therefore, whether information stored in a unit cell of the phase change memory device is logic "1" or logic "0" may be determined by sensing the current that flows through the transition volume 20 in a read mode.

In the structure described above, as the transition volume 20 increases, the program current has to increase proportionally. In this case, the access device should be designed to have a sufficient current driving capacity to supply the program current. However, to improve the current driving capacity, the area occupied by the access device should be increased. This in turn means that the overall size of the memory device needs to increase. This is contrary to the requirement of increasing the integration density of the memory device (i.e., the requirement to keep the memory device small.) There is therefore a need to keep the area of the transition volume 20 small so as to keep the overall size of the memory device small. In other words, a smaller transition volume 20 results in a higher integration density of the phase change memory device.

Methods of reducing the transition volume 20 are disclosed in U.S. Pat. No. 7,012,273 entitled "Phase Change Memory Device Employing Thermal-Electrical Contacts with Narrowing Electrical Current Paths" to Chen.

According to Chen, an upper electrode and a lower electrode which are spaced apart from each other are provided. A phase change layer is interposed between the upper electrode and the lower electrode. The lower electrode is disposed at a lower end part of a contact hole passing through an interlayer insulating layer. A sidewall of the contact hole above the lower electrode is covered with an insulating spacer. The phase change layer is disposed along the insulating spacer and a surface of the lower electrode. The upper electrode filling the contact hole is disposed above the phase change layer. In this case, a transition volume may be determined depending on the contact area between the lower electrode and the phase change layer. While the above described structure may contain the size of the transition volume, there is a need for a technique capable of further reducing the transition volume to be smaller is required.

SUMMARY OF THE INVENTION

One aspect of the present disclosure includes a phase change memory device. The phase change memory device includes a lower electrode provided on a substrate, an interlayer insulating layer including a contact hole exposing the lower electrode, and covering the substrate, a resistant material pattern filling the contact hole, a phase change pattern interposed between the resistant material pattern and the interlayer insulating layer, and extending between the resistant material pattern and the lower electrode, wherein the resistant material pattern has a higher resistance than the phase change pattern, and an upper electrode in contact with the phase change pattern, the upper electrode being electrically connected to the lower electrode through the phase change pattern.

Another aspect of the present disclosure includes a method of fabricating a phase change memory device. The method includes providing a substrate including a lower electrode and an interlayer insulating layer, the interlayer insulating layer covering the substrate and including a contact hole exposing the lower electrode, forming a phase change layer covering the interlayer insulating layer, sidewalls of the contact hole, and the exposed lower electrode, forming a resistant material layer filling the contact hole on the phase change layer, the resistant material layer having a higher resistance than the phase change layer, planarizing the resistant material layer and the phase change layer to form a resistant material pattern and a phase change pattern remaining in the contact hole, and forming an upper electrode in contact with the phase change pattern, the upper electrode being electrically connected to the lower electrode through the phase change pattern

BRIEF DESCRIPTION OF THE DRAWINGS

The foregoing and other features of the invention will be apparent from the more particular description of an exemplary embodiment of the invention, as illustrated in the accompanying drawing. The drawing is not necessarily to scale, emphasis instead being placed upon illustrating the principles of the invention.

DETAILED DESCRIPTION

Figure 1:
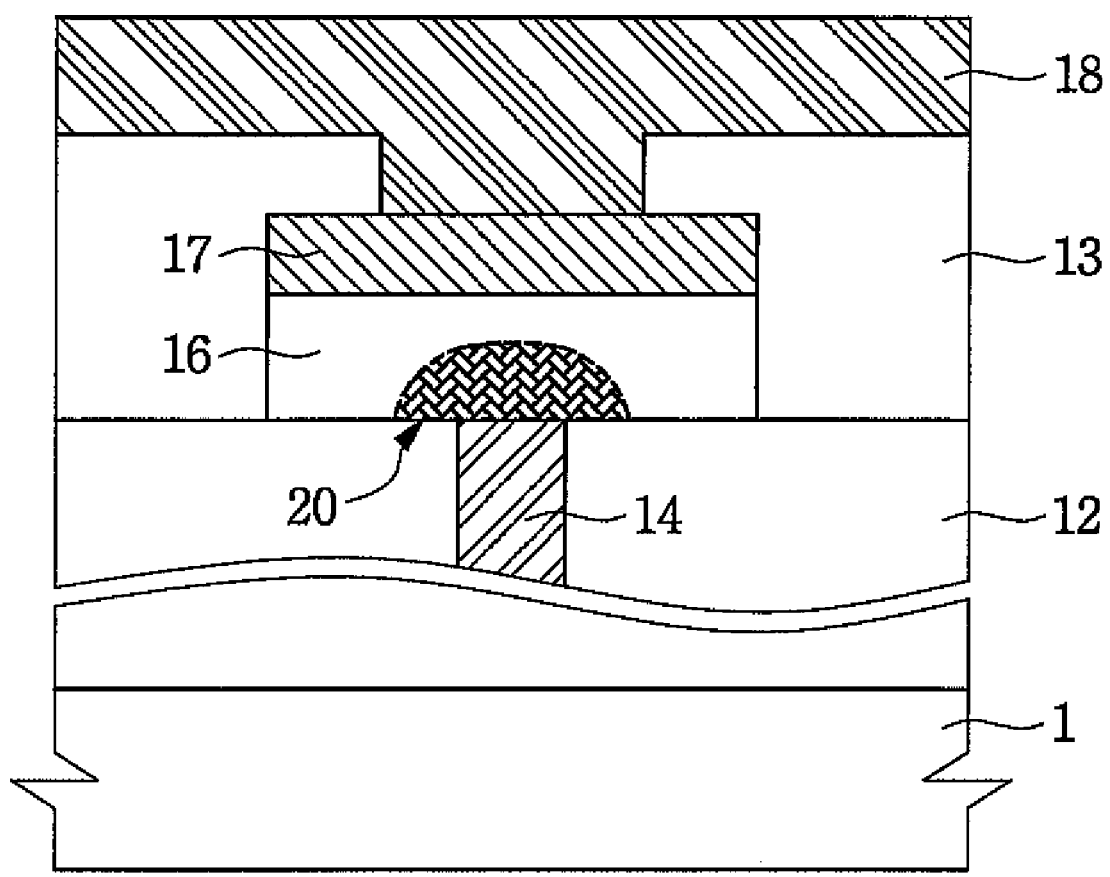
FIG. 1 is a cross-sectional view of a conventional phase change memory device.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like reference numerals designate like elements throughout the specification.

Figure 2:
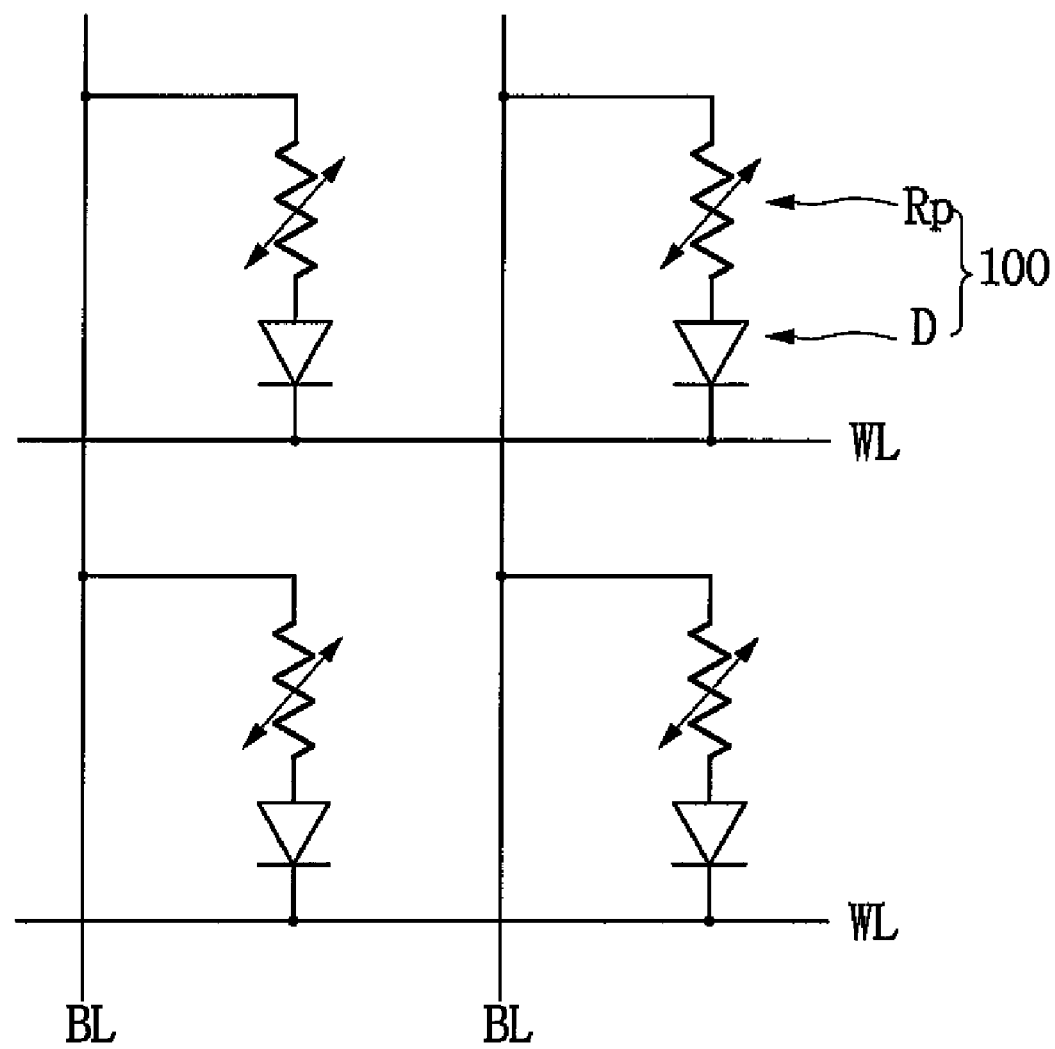
FIG. 2 is an equivalent circuit diagram of a part of a cell array region of a phase change memory device according to an exemplary disclosed embodiment.

FIG. 2 is an equivalent circuit diagram of part of a cell array region of a phase change memory device according to an exemplary disclosed embodiment. Referring to FIG. 2, a plurality of word lines (WL), a plurality of bit lines (BL) and a plurality of phase change memory cells 100 may be provided in the cell array region. The bit lines may be disposed to cross the word lines. The phase change memory cells 100 may be disposed at intersecting points of the word lines and the bit lines.

Each of the phase change memory cells 100 may include a phase change pattern (Rp) electrically connected to one of the bit lines, and a switching device electrically connected to the phase change pattern. In an exemplary embodiment, the switching device may be a diode (D). One end of the diode (D) may be electrically connected to one of the word lines. Alternatively, the switching device may be a metal-oxide semiconductor (MOS) transistor.

Figure 3:
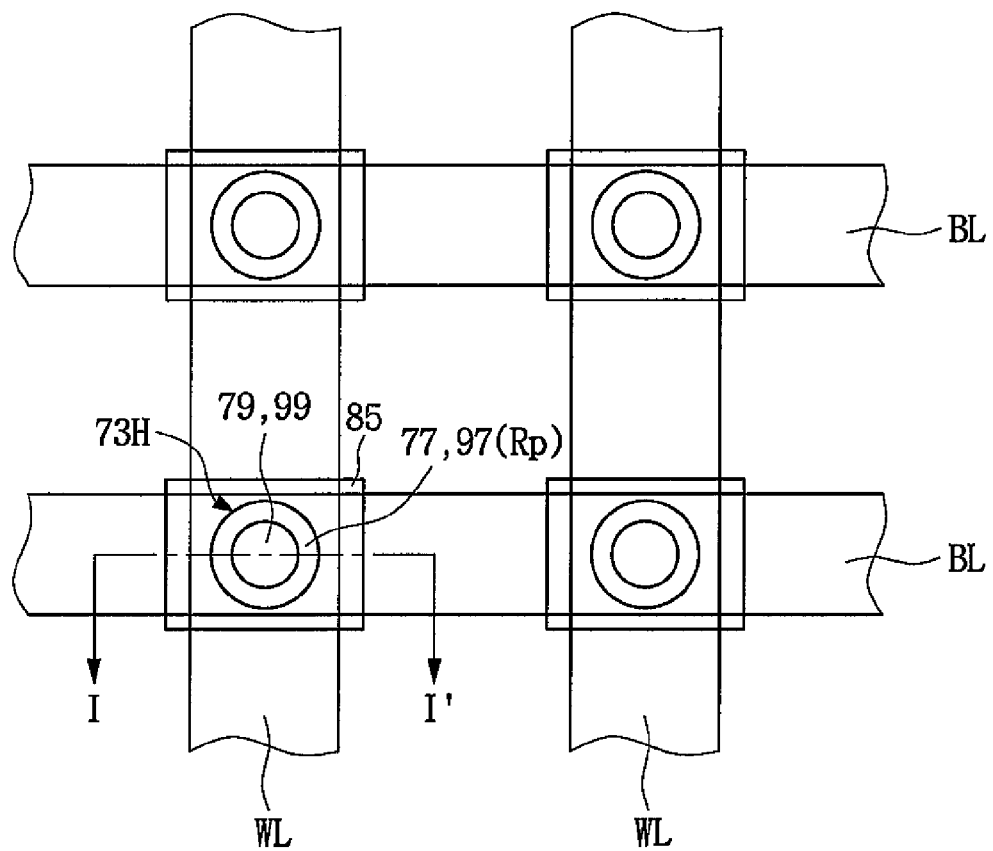
FIG. 3 is a top view of a part of a cell array region of a phase change memory device according to an exemplary disclosed embodiment.

FIG. 3 is a top view of a part of a cell array region of a phase change memory device according to an exemplary disclosed embodiment. In other words, FIG. 3 is a top view of a part of the cell array region of FIG. 2. In addition, FIG. 4 is a cross-sectional view taken along line I-I' of FIG. 3, illustrating a phase change memory device according to an exemplary disclosed embodiment.

Figure 4:
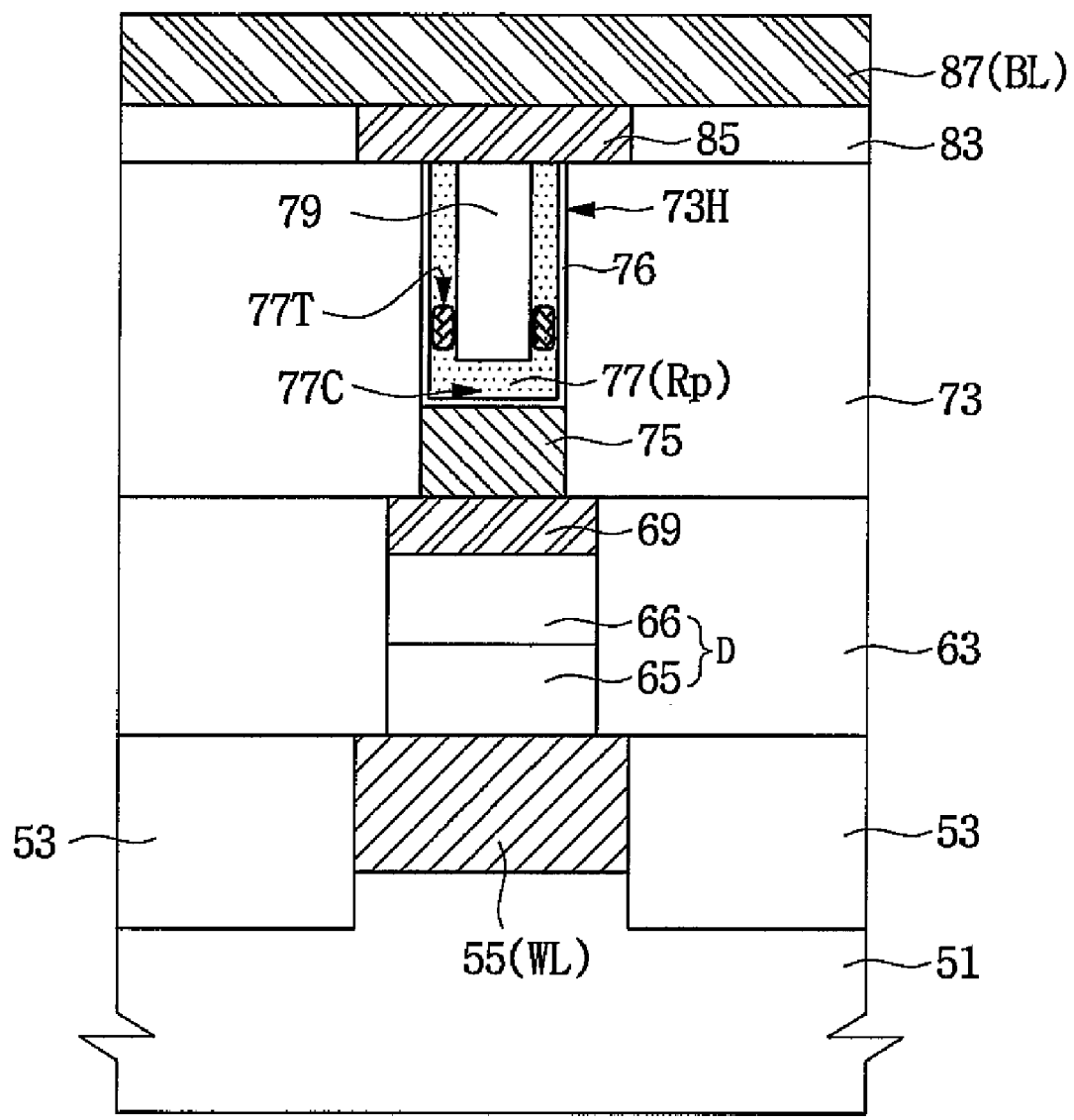
FIG. 4 is a cross-sectional view taken along line I-I' of FIG. 3, illustrating a phase change memory device according to an exemplary disclosed embodiment.

Referring to FIGS. 3 and 4, a phase change memory device according to an exemplary disclosed embodiment may include word lines (WL) 55 and bit lines (BL) 87, both of which are provided on a substrate 51. The substrate 51 may be a semiconductor substrate such as a silicon wafer. The word lines 55 may be defined by an isolation layer 53 disposed on the substrate 51. The isolation layer 53 may be formed of an insulating layer such as, for example, a silicon oxide layer, a silicon nitride layer, a silicon oxynitride layer, or a combination thereof.

The word lines WL may be high-concentration impurity implantation regions. Alternatively, the word lines WL may be conductive lines stacked on the substrate 51. The conductive lines may be formed of a metal line or an epitaxial semiconductor pattern.

A lower insulating layer 63 may be provided on the word lines WL and the isolation layer 53. The lower insulating layer 63 may be formed of an insulating layer such as, for example, a silicon oxide layer, a silicon nitride layer, a silicon oxynitride layer, or a combination thereof. Diodes D may be disposed in the lower insulating layer 63. The diode D may include a first semiconductor pattern 65 and a second semiconductor pattern 66.

The first semiconductor pattern 65 may be an n-type or p-type semiconductor layer. The second semiconductor pattern 66 may be a semiconductor layer having a conductivity type different from the first semiconductor pattern 65. For example, when the first semiconductor pattern 65 is an n-type semiconductor layer, the second semiconductor pattern 66 may be a p-type semiconductor layer.

The first semiconductor pattern 65 and the second semiconductor pattern 66 may be sequentially stacked on a predetermined region of the word lines WL. In this case, the first semiconductor pattern 65 may be in contact with the word lines WL. A diode electrode 69 may be disposed on the second semiconductor pattern 66. The diode electrode 69 may be formed of a conductive layer such as a metal layer or a metal silicide layer. However, in an alternative exemplary embodiment, the diode electrode 69 may be omitted.

An interlayer insulating layer 73 may be formed on the diodes D and the lower insulating layer 63. The interlayer insulating layer 73 may be formed of an insulating layer such as, for example, a silicon oxide layer, a silicon nitride layer, a silicon oxynitride layer, or a combination thereof. A contact hole 73H passing through the interlayer insulating layer 73 may be disposed over the diode electrode 69.

A lower electrode 75 filling a lower end part of the contact hole 73H may be provided. In an exemplary embodiment, a diameter of the lower electrode 75 may be the same as that of the contact hole 73H. The lower electrode 75 may be in contact with the diode electrode 69. Alternatively, in case a diode electrode 69 is not provided, the lower electrode 75 may be in contact with the second semiconductor pattern 66. The lower electrode 75 may be made of a material from a group including a Ti layer, a TiN layer, a TiAlN layer, a W layer, a WN layer, a Si layer, a Ta layer, a TaN layer, a TaCN layer, and a WCN layer.

A resistant material pattern 79 filling a remaining portion of the contact hole 73H may be disposed on the lower electrode 75. A phase change pattern (Rp) 77 may be interposed between the resistant material pattern 79 and the interlayer insulating layer 73. Also, the phase change pattern 77 may extend between the resistant material pattern 79 and the lower electrode 75. A region where the phase change pattern 77 overlaps the lower electrode 75 may have the same size as a top surface of the lower electrode 75.

The phase change pattern 77 may include one selected from a first material group including Ge—Sb—Te, Ge—Bi—Te, Ge—Te—As, Ge—Te—Sn, Ge—Te, Ge—Te—Sn—O, Ge—Te—Sn—Au, Ge—Te—Sn—Pd, Ge—Te—Se, Ge—Te—Ti, Ge—Sb, (Ge, Sn)—Sb—Te, Ge—Sb—(SeTe), Ge—Sb—In, and Ge—Sb—Te—S. Furthermore, the phase change pattern 77 may include a compound in which one selected from the first material group is doped with one selected from a second material group including N, O, Bi, Sn, B, and Si.

The resistant material pattern 79 may be formed of a material layer having a higher resistance than the phase change pattern 77. Furthermore, the resistant material pattern 79 may be a dielectric layer. In an exemplary embodiment, the resistant material pattern 79 may include one selected from the group including TiO, ZrO, MgO, NiO, GeO, SbO, TeO, $SiO_2$, SiN, and SiON.

A seed layer 76 may be interposed between the phase change pattern 77 and the interlayer insulating layer 73. The seed layer 76 may extend between the phase change pattern 77 and the lower electrode 75. In an exemplary embodiment, the seed layer 76 may include one selected from the group consisting of TiO, ZrO, MgO, NiO, GeO, SbO, and TeO. Also, the seed layer 76 may be the same material layer as the resistant material pattern 79. The seed layer 76 may have a relatively smaller thickness than the phase change pattern 77.

An upper end part of the phase change pattern 77 may have a doughnut shape when viewed from a top view. The upper end part of the phase change pattern 77 may be formed to a predetermined thickness along sidewalls of the contact hole 73H. In this case, the resistant material pattern 79 may be surrounded by the phase change pattern 77. Furthermore, the phase change pattern 77 may be surrounded by the seed layer 76. The upper end part of the phase change pattern 77 may occupy 1% to 99% of the diameter of the contact hole 73H.

An upper insulating layer 83 covering the interlayer insulating layer 73 may be disposed. The upper insulating layer 83 may be formed of an insulating layer such as, for example, a silicon oxide layer, a silicon nitride layer, a silicon oxynitride layer, or a combination thereof.

An upper electrode 85 in contact with the phase change pattern 77 may be disposed in the upper insulating layer 83. The upper electrode 85 may be disposed to cover the contact hole 73H. The bit line 87 crossing the upper electrode 85 may be disposed on the upper insulating layer 83.

The upper electrode 85 may include one selected from a group including Ti layer, a TiN layer, a TiAlN layer, a W layer, a WN layer, a Si layer, a Ta layer, a TaN layer, a TaCN layer, and a WCN layer. The bit line 87 may be formed of a conductive layer such as, for example, a metal layer, a polysilicon layer, a metal silicide layer or a combination thereof.

The bit line 87 may be electrically connected to the word line 55 through the upper electrode 85, the phase change pattern 77, the lower electrode 75, the diode electrode 69, and the diode D. When the seed layer 76 is interposed between the phase change pattern 77 and the lower electrode 75, a tunneling current may flow between the phase change pattern 77 and the lower electrode 75 through the seed layer 76.

The operation of a phase change memory device according to an exemplary disclosed embodiment will now be described with reference to FIGS. 2 to 4.

Referring to FIGS. 2 to 4, a write current may be applied to a corresponding one of the word lines WL and a corresponding one of the bit lines BL in order to selectively store data in one of the phase change memory cells 100. In this case, electrical resistance of the phase change patterns Rp may vary depending on an amount of write current.

Specifically, when the phase change patterns Rp are heated by the write current to a temperature between its crystallization temperature and melting point, and then when the patterns Rp are cooled, the phase change patterns Rp may be changed into a crystalline state. On the other hand, when the phase change patterns Rp are heated by the write current to a higher temperature than the melting point, and then the patterns Rp are abruptly quenched, the phase change patterns Rp may be changed into an amorphous state.

The resistivity of the phase change patterns Rp in the crystalline state may be different from that of the phase change patterns Rp in the amorphous state. For example, the resistivity of the phase change patterns Rp in the crystalline state may be lower than that of the phase change patterns Rp in the amorphous state. Accordingly, a current that flows through the phase change patterns Rp is sensed in a read mode, and thus it can be determined whether information stored in the phase change patterns Rp is logic "1" or logic "0".

More specifically, the write current may be applied to the selected one of the word lines 55 and the corresponding one of the bit lines 87. A lower end part 77C of the phase change pattern 77 in contact with the lower electrode 75 may have a larger cross-sectional area than the phase change pattern 77 interposed between the resistant material pattern 79 and the interlayer insulating layer 73. In this case, a current density for the phase change pattern 77 interposed between the resistant material pattern 79 and the interlayer insulating layer 73 may be higher than that of the lower end part 77C of the phase change pattern 77. As a result, a transition volume 77T may be formed in the phase change pattern 77 interposed between the resistant material pattern 79 and the interlayer insulating layer 73. In other words, the transition volume 77T may be spaced apart from the lower electrode 75 by a predetermined distance.

The transition volume 77T may be heated by the write current to a temperature between its crystallization temperature and melting point, and then cooled. As a result, the transition volume 77T may be changed into a crystalline state. Also, the write current is controlled, so that some of the phase change patterns Rp can be changed into an amorphous state. Consequently, the phase change patterns Rp may store the data of logic "1" or logic "0".

As described above, the transition volume 77T may have a relatively smaller cross-sectional area than the lower end part 77C of the phase change pattern 77. Accordingly, the current required to convert the transition volume 77T into the crystalline or amorphous state may be considerably reduced compared to the conventional art.

Figure 5:
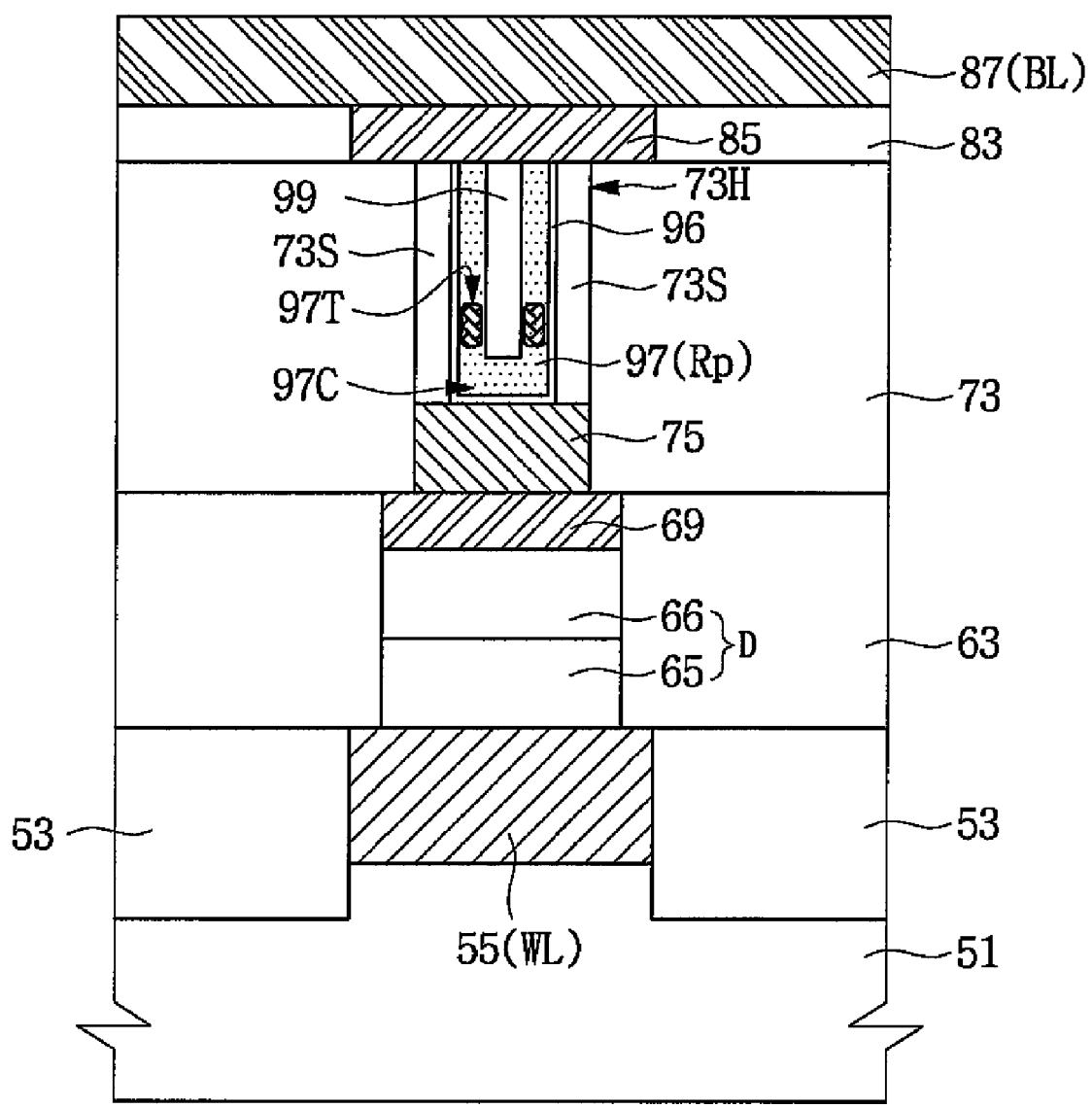
FIG. 5 is a cross-sectional view taken along line I-I' of FIG. 3, illustrating a phase change memory device according to an alternative exemplary embodiment.

FIG. 5 is a cross-sectional view taken along line I-I' of FIG. 3, illustrating a phase change memory device according to an alternative exemplary disclosed embodiment.

Referring to FIGS. 3 and 5, the phase change memory device according to an alternative exemplary embodiment may include word lines (WL) 55, bit lines (BL) 87, an isolation layer 53, a lower insulating layer 63, diodes D, a diode electrode 69, an interlayer insulating layer 73, a contact hole 73H, and a lower electrode 75 as described with reference to FIG. 4. Only the differences between FIGS. 4 and 5 will be discussed below.

Insulating spacers 73S may be formed on sidewalls of the contact hole 73H. The insulating spacers 73S may be disposed at an upper level of the lower electrode 75. Furthermore, the insulating spacers 73S may be formed to cover the interlayer insulating layer 73 exposed on the sidewalls of contact hole 73H with a uniform thickness. The insulating spacers 73S may be formed of an insulating layer such as, for example, a silicon oxide layer, a silicon nitride layer, a silicon oxynitride layer, or a combination thereof.

A resistant material pattern 99 filling a remaining portion of the contact hole 73H may be disposed on the lower electrode 75. A phase change pattern 97 may be interposed between the resistant material pattern (Rp) 99 and the insulating spacers 73S. Also, the phase change pattern (Rp) 97 may extend between the resistant material pattern 99 and the lower electrode 75. A region where the phase change pattern 97 overlaps the lower electrode 75 may be smaller than a top surface of the lower electrode 75.

The phase change pattern 97 may include material selected from a first material group including Ge—Sb—Te, Ge—Bi—Te, Ge—Te—As, Ge—Te—Sn, Ge—Te, Ge—Te—Sn—O, Ge—Te—Sn—Au, Ge—Te—Sn—Pd, Ge—Te—Se, Ge—Te—Ti, Ge—Sb, (Ge, Sn)—Sb—Te, Ge—Sb—(SeTe), Ge—Sb—In, and Ge—Sb—Te—S. The phase change pattern 97 may also include a compound in which the one selected from the first material group is doped with one selected from a second material group including N, O, Bi, Sn, B and Si.

The resistant material pattern 99 may be formed of a material layer having a higher resistance than the phase change pattern 97. Also, the resistant material pattern 99 may be a dielectric layer. In an exemplary embodiment, the resistant material pattern 99 may include one selected from the group including TiO, ZrO, MgO, NiO, GeO, SbO, TeO, $SiO_2$, SiN, and SiON.

A seed layer 96 may be interposed between the phase change pattern 97 and the insulating spacer 73S. Specifically, the seed layer 96 may extend between the phase change pattern 97 and the lower electrode 75. In an exemplary embodiment, the seed layer 96 may include material selected from the group including TiO, ZrO, MgO, NiO, GeO, SbO, and TeO. Also, the seed layer 96 and the resistant material pattern 99 may be formed of the same material layer. The seed layer 96 may have a relatively smaller thickness than the phase change pattern 97.

An upper end part of the phase change pattern 97 may have a doughnut shape when viewed from the top view. Furthermore, the upper end part of the phase change pattern 97 may be formed to a constant thickness along the sidewalls of the contact hole 73H. In this case, the resistant material pattern 99 may be surrounded by the phase change pattern 97. Furthermore, the phase change pattern 97 may be surrounded by the seed layer 96. The upper end part of the phase change pattern 97 may occupy 1% to 99% of the diameter of the contact hole 73H.

An upper insulating layer 83 covering the interlayer insulating layer 73 may be disposed. Furthermore, an upper electrode 85 in contact with the phase change pattern 97 may be disposed in the upper insulating layer 83. In particular, the upper electrode 85 may be disposed to cover the contact hole 73H. Furthermore, the bit line 87 crossing the upper electrode 85 may be disposed on the upper insulating layer 83.

The bit lines 87 may be electrically connected to the word lines 55 through the upper electrode 85, the phase change pattern 97, the lower electrode 75, the diode electrode 69 and the diode D. Furthermore, when the seed layer 96 is interposed between the phase change pattern 97 and the lower electrode 75, a tunneling current may flow between the phase change pattern 97 and the lower electrode 75 through the seed layer 96.

The write current may be applied to the one of the word lines 55 that is selected and the corresponding one of the bit lines 87. A lower end part 97C of the phase change pattern 97 in contact with the lower electrode 75 may have a larger cross-sectional area than the phase change pattern 97 interposed between the resistant material pattern 99 and the insulating spacer 73S. In this case, a current density of the phase change pattern 97 interposed between the resistant material pattern 99 and the insulating spacer 73S may be higher than that of the lower end part 97C of the phase change pattern 97. As a result, a transition volume 97T may be formed in the phase change pattern 97 interposed between the resistant material pattern 99 and the insulating spacer 73S. In other words, the transition volume 97T may be spaced apart from the lower electrode 75 by a predetermined distance.

The transition volume 97T may be heated by the write current to a temperature between its crystalline temperature and melting point, and then cooled. As a result, the transition volume 97T may be changed into a crystalline state.

As described above, the transition volume 97T may have a relatively smaller cross-sectional area than the lower end part 97C of the phase change pattern 97. Consequently, the current required to convert the transition volume 97T into the crystalline or amorphous state may be considerably reduced compared to the conventional art.

Figure 14:
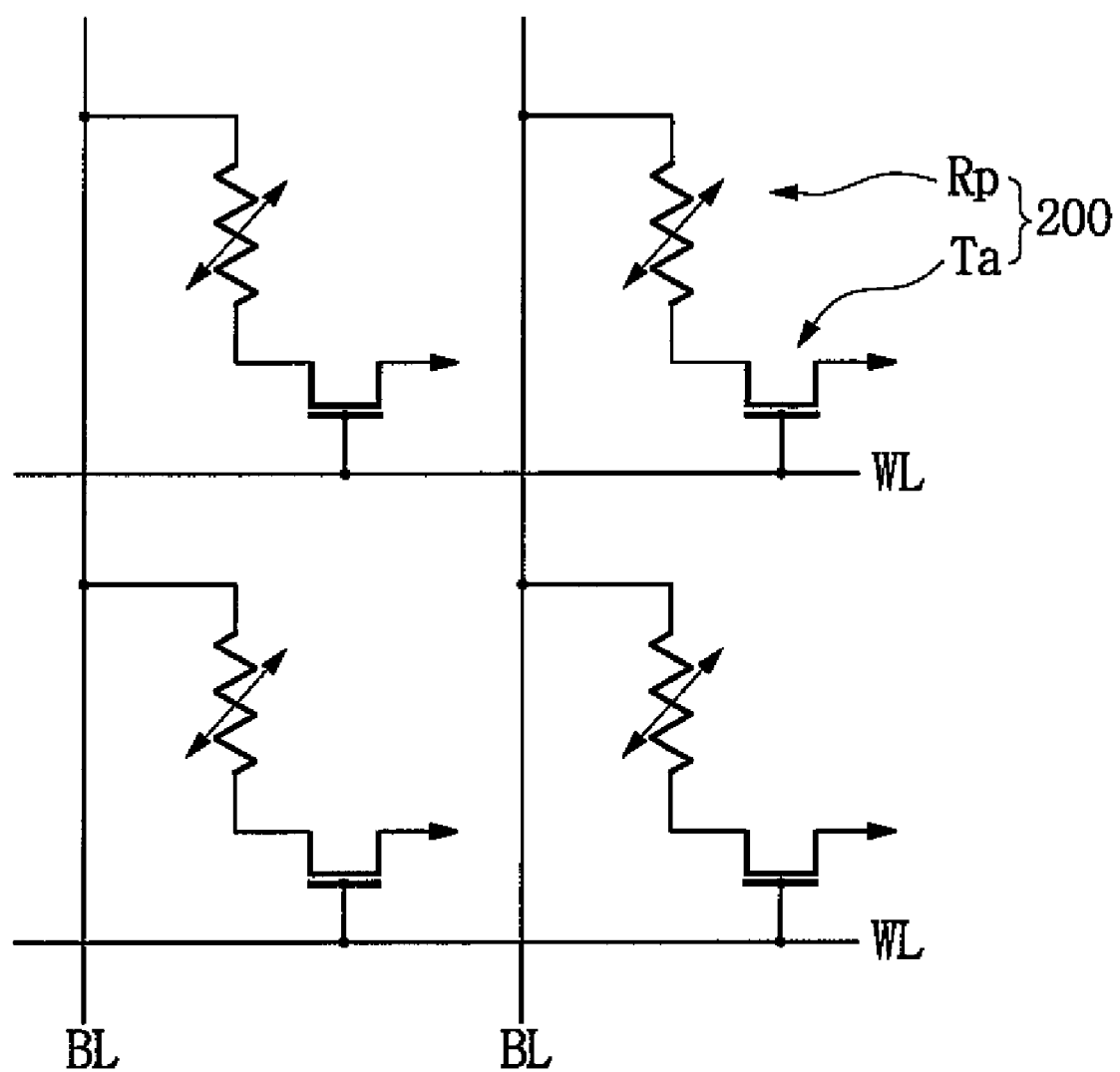
FIG. 14 is an equivalent circuit diagram of a part of a cell array region of a phase change memory device according to another alternative exemplary disclosed embodiment.
Figure 15:
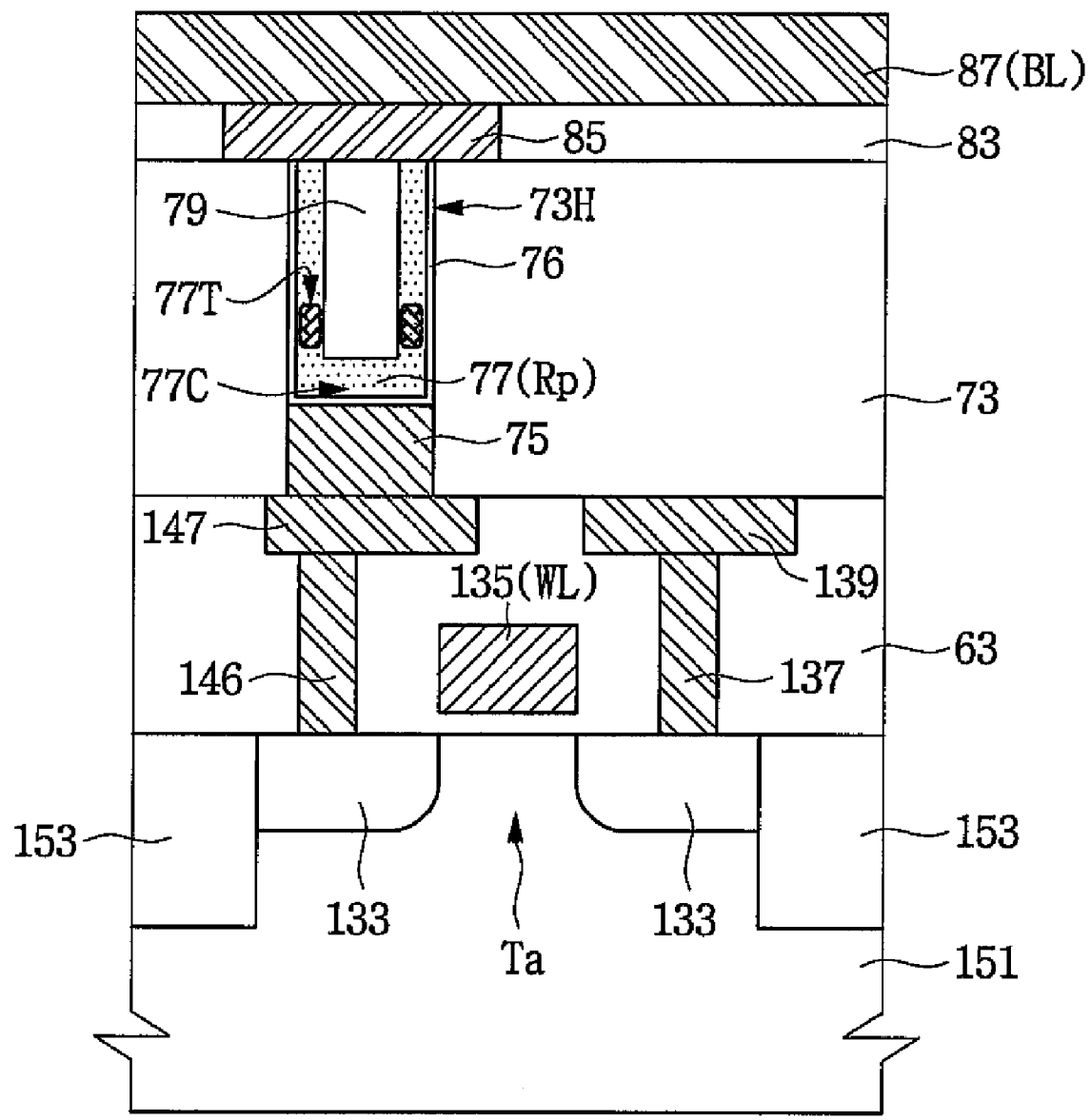
FIG. 15 is a cross-sectional view of the phase change memory device disclosed in FIG. 14 according to an exemplary disclosed embodiment.

FIG. 14 is an equivalent circuit diagram of a cell array region of a phase change memory according to another alternative exemplary embodiment and FIG. 15 is a cross-sectional view of a phase change memory device that is part of the cell array displayed in FIG. 14.

Referring to FIG. 14, a plurality of word lines WL, a plurality of bit lines BL and a plurality of phase change memory cells 200 may be provided in the cell array region of the phase change memory device. The bit lines BL may be disposed to cross the word lines WL. The phase change memory cells 200 may be disposed at intersecting points of the word lines WL and the bit lines BL.

Each of the phase change memory cells 200 may include a phase change pattern Rp electrically connected to one of the bit lines BL, and a switching device electrically connected to the phase change pattern Rp. The switching device may be a MOS transistor Ta. The base of the MOS transistor Ta may be electrically connected to one of the word lines WL.

Referring to FIG. 15, the phase change memory device may include word lines (WL) 135 and bit lines (BL) 87, both of which are provided on a substrate 151. The substrate 151 may be a semiconductor substrate such as a silicon wafer.

An isolation layer 153 defining an active region may be disposed in the substrate 151. The isolation layer 153 may be formed of an insulating layer such as, for example, a silicon oxide layer, a silicon nitride layer, a silicon oxynitride layer, or a combination thereof. A gate electrode 135 may be disposed on the active region. The gate electrode 135 may serve as the word line WL. The gate electrode 135 may be formed of a conductive layer such as a polysilicon layer, a metal layer, a metal silicide layer, or a combination thereof. Source and drain regions 133 may be disposed in the active region on both sides of the gate electrode 135. The gate electrode 135, the substrate 151, and the source and drain regions 133 may constitute a MOS transistor Ta.

The MOS transistor Ta and the isolation layer 153 may be covered with a lower insulating layer 63. The lower insulating layer 63 may be formed of an insulating layer such as, for example, a silicon oxide layer, a silicon nitride layer, a silicon oxynitride layer, or a combination thereof.

A source line 139 and a drain pad 147 may be disposed in the lower insulating layer 63. The source line 139 may be electrically connected to one of the source and drain regions 133 through a source plug 137 passing through the lower insulating layer 63. The drain pad 147 may be electrically connected to the other of the source and drain regions 133 through a drain plug 146 passing through the lower insulating layer 63. The source line 139, the drain pad 147, the source plug 137, and the drain plug 146 may be formed of a conductive layer.

An interlayer insulating layer 73 may be provided on the lower insulating layer 63. The interlayer insulating layer 73 may be formed of an insulating layer such as, for example, a silicon oxide layer, a silicon nitride layer, a silicon oxynitride layer, or a combination thereof. The phase change memory device may also include a contact hole 73H passing through the interlayer insulating layer 73.

A lower electrode 75 filling a lower end part of the contact hole 73H may also be provided. In an exemplary embodiment, the lower electrode 75 and the contact hole 73H may have the same diameter. Additionally, the lower electrode 75 may be in contact with the drain pad 147. The lower electrode 75 may include one selected from a group including a Ti layer, a TiN layer, a TiAlN layer, a W layer, a WN layer, a Si layer, a Ta layer, a TaN layer, a TaCN layer, and a WCN layer.

As illustrated in FIG. 15, the resistant material pattern 79, the phase change pattern (Rp) 77, the seed layer 76, the upper insulating layer 83, the upper electrode 85, and the bit line 87 may be included as described with reference to FIG. 4. Therefore, matter related to these components of the phase change memory device will not be described again.

FIGS. 6 to 10 are cross-sectional views taken along line I-I' of FIG. 3, illustrating a method of fabricating the phase change memory device according to an exemplary disclosed embodiment.

Figure 6:
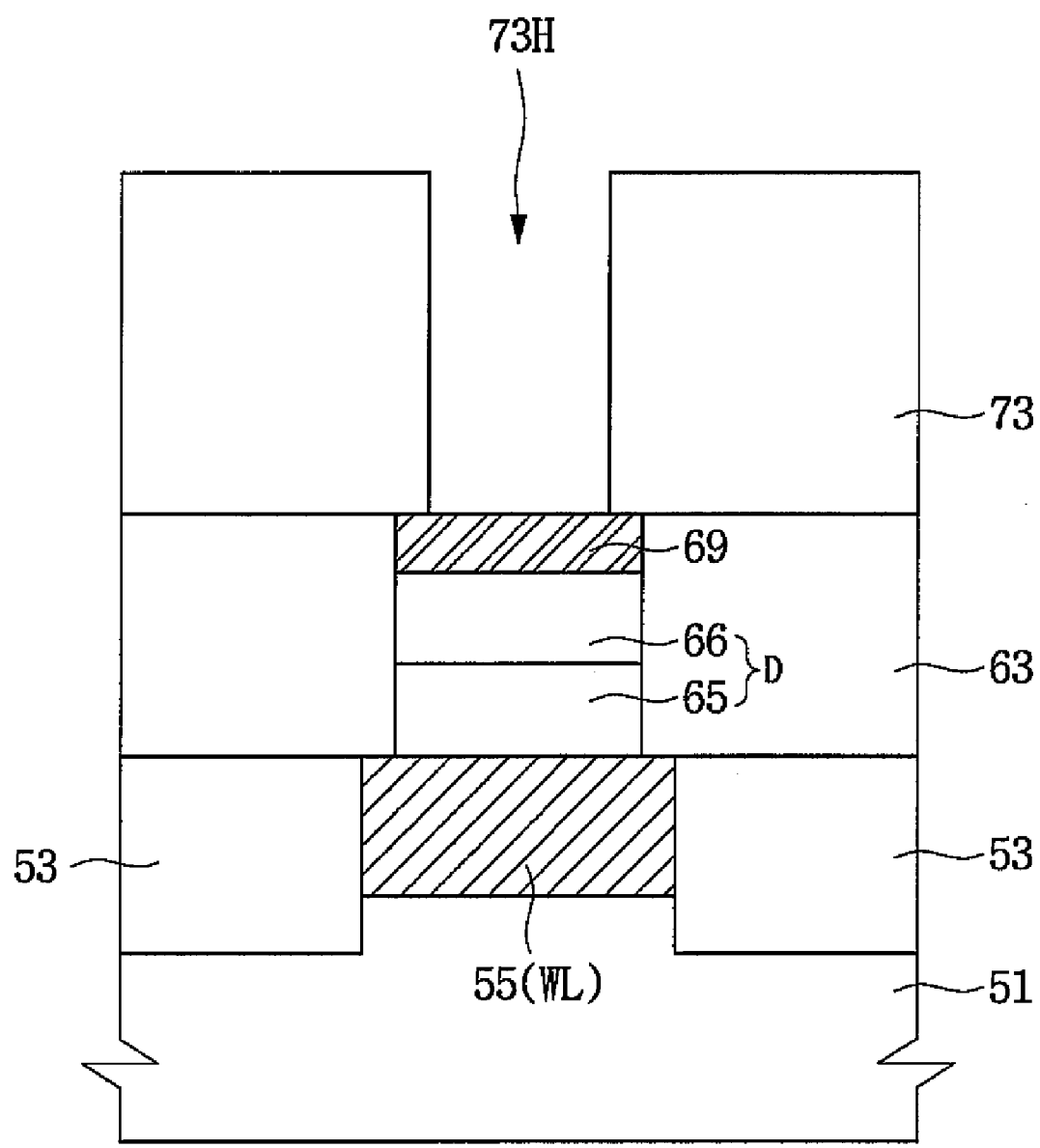
FIGS. 6 to 10 are cross-sectional views taken along line I-I' of FIG. 3, illustrating a method of fabricating the phase change memory device according to an exemplary disclosed embodiment.

Referring to FIGS. 3 and 6, an isolation layer 53 defining a word line 55 may be formed on a substrate 51. The substrate 51 may be formed of a semiconductor substrate such as a silicon wafer. The isolation layer 53 may be formed by a trench isolation technique. Specifically, the isolation layer 53 may be formed of an insulating layer such as a silicon oxide layer, a silicon nitride layer, a silicon oxynitride layer, or a combination thereof. Furthermore, the word line 55 may be a high-concentration ion implantation region. Alternatively, the word lines 55 may be conductive lines stacked on the substrate 51. The conductive line may be formed of a metal line or an epitaxial semiconductor pattern.

A lower insulating layer 63 may be formed on the word line 55 and the isolation layer 53. The lower insulating layer 63 may be formed of an insulating layer such as, for example, a silicon oxide layer, a silicon nitride layer, a silicon oxynitride layer, or a combination thereof. Diodes D may be formed in the lower insulating layer 63. In particular, a first semiconductor pattern 65 and a second semiconductor pattern 66 may be sequentially stacked on a predetermined region of the word line 55 to thereby form the diode D.

The first semiconductor pattern 65 may be formed of an n-type or p-type semiconductor layer. The second semiconductor pattern 66 may be formed of a semiconductor layer having a conductivity type different from the first semiconductor pattern 65. For example, in an exemplary embodiment, the first semiconductor pattern 65 is formed of an n-type semiconductor layer, and the second semiconductor pattern 66 may be formed of a p-type semiconductor layer.

A diode electrode 69 may be formed on the second semiconductor pattern 66. The diode electrode 69 may be formed of a conductive layer such as a metal layer or a metal silicide layer. Furthermore, the lower insulating layer 63 and a top surface of the diode electrode 69 may be planarized. In this case, the top surface of the diode electrode 69 may be exposed.

An interlayer insulating layer 73 covering the lower insulating layer 63 may be formed. The interlayer insulating layer 73 may be formed of an insulating layer such as, for example, a silicon oxide layer, a silicon nitride layer, a silicon oxynitride layer, or a combination thereof. Additionally, a contact hole 73H passing through the interlayer insulating layer 73 and exposing the diode electrode 69 may be formed.

Figure 7:
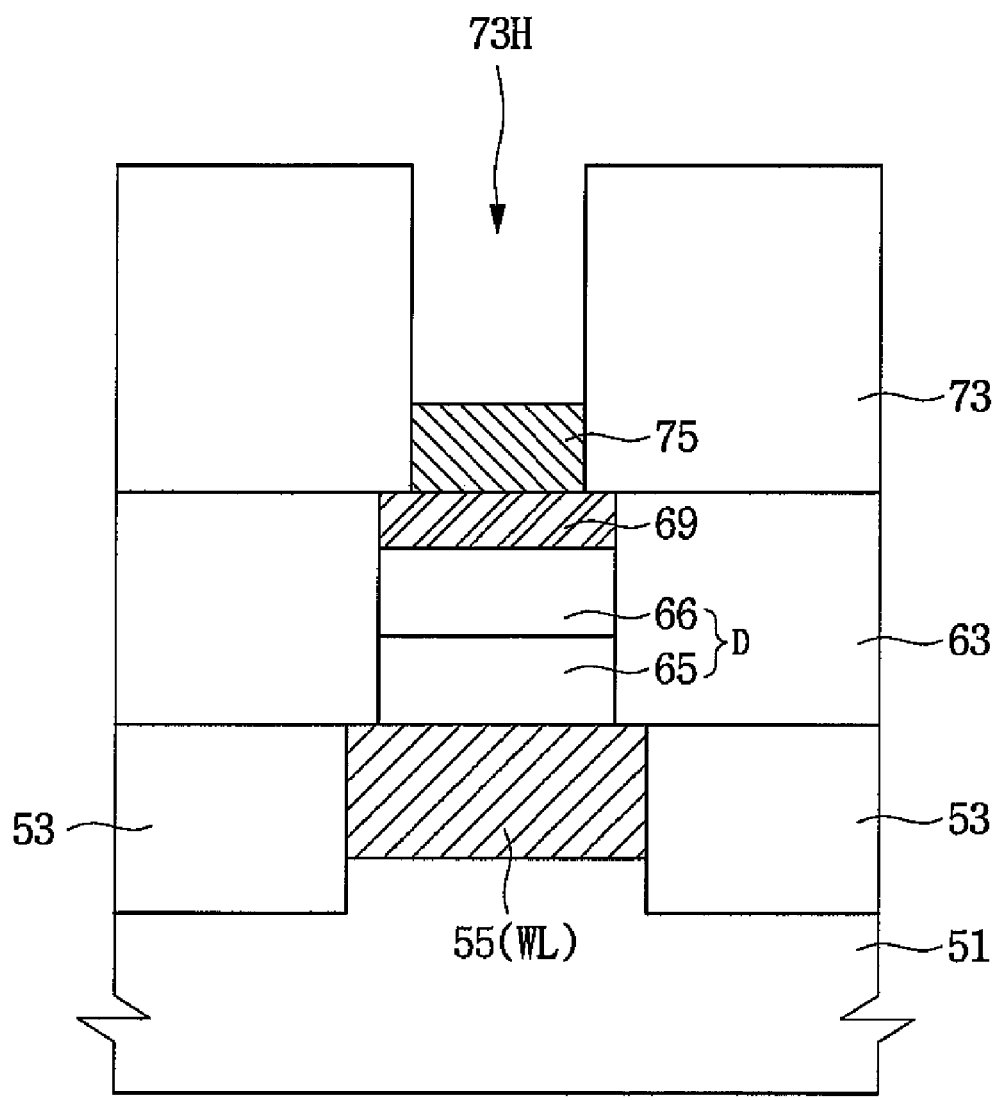

Referring to FIGS. 3 and 7, a lower electrode 75 filling a lower end part of the contact hole 73H may be formed. The lower electrode 75 may be formed to include a material from the group including a Ti layer, a TiN layer, a TiAlN layer, a W layer, a WN layer, a Si layer, a Ta layer, a TaN layer, a TaCN layer, and a WCN layer.

The lower electrode 75 may be formed by forming a conductive layer filling the contact hole 73H, and then etching-back the conductive layer. In this case, the diameter of the lower electrode 75 may be the same as that of the contact hole 73H. Moreover, the lower electrode 75 may be in contact with the diode electrode 69.

Figure 8:
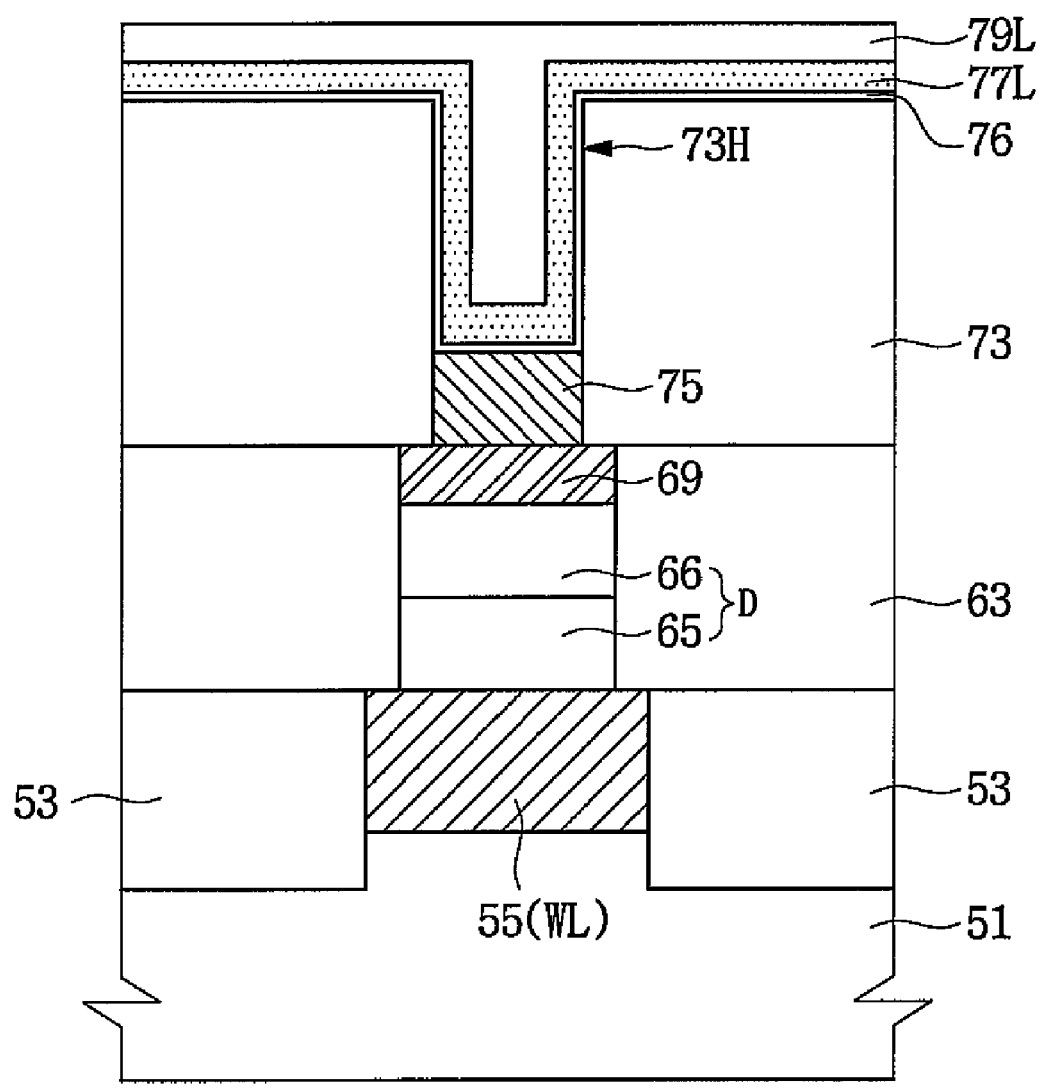

Referring to FIGS. 3 and 8, a seed layer 76, a phase change layer 77L, and a resistant material layer 79L may be sequentially stacked on the substrate 51 having the lower electrode 75. In an exemplary embodiment, the seed layer 76, the phase change layer 77L, and the resistant material layer 79L may be formed by an in-situ process. In this case, the seed layer 76 and the resistant material layer 79L may be formed of the same material layer.

The seed layer 76 may be formed to cover the lower electrode 75, the remaining sidewalls of the contact hole 73H, and the interlayer insulating layer 73. Thus, the seed layer 76 may support the uniform formation of the phase change layer 77L. In addition, the seed layer 76 may be formed to a relatively smaller thickness than the phase change layer 77L. In an exemplary embodiment, the seed layer 76 may be formed of a material from the group including TiO, ZrO, MgO, NiO, GeO, SbO, and TeO. However, in an alternative exemplary embodiment, the seed layer 76 may be omitted.

The phase change layer 77L may be formed on the seed layer 76. The phase change layer 77L may be formed of a material from a first material group including Ge—Sb—Te, Ge—Bi—Te, Ge—Te—As, Ge—Te—Sn, Ge—Te, Ge—Te—Sn—O, Ge—Te—Sn—Au, Ge—Te—Sn—Pd, Ge—Te—Se, Ge—Te—Ti, Ge—Sb, (Ge, Sn)—Sb—Te, Ge—Sb—(SeTe), Ge—Sb—In, and Ge—Sb—Te—S. Also, the phase change layer 77L may be formed of a compound in which the one selected from the first material group is doped with one from a second material group including N, O, Bi, Sn, B and Si.

The resistant material layer 79L may be formed on the phase change layer 77L in order to fill the remaining portion of the contact hole 73H. The resistant material layer 79L may be formed of a material layer having a higher resistance than the phase change layer 77L. Also, the resistant material layer 79L may be formed of a dielectric layer. In addition, the resistant material layer 79L may be formed of material selected from the group including TiO, ZrO, MgO, NiO, GeO, SbO, TeO, $SiO_2$, SiN, and SiON.

Figure 9:
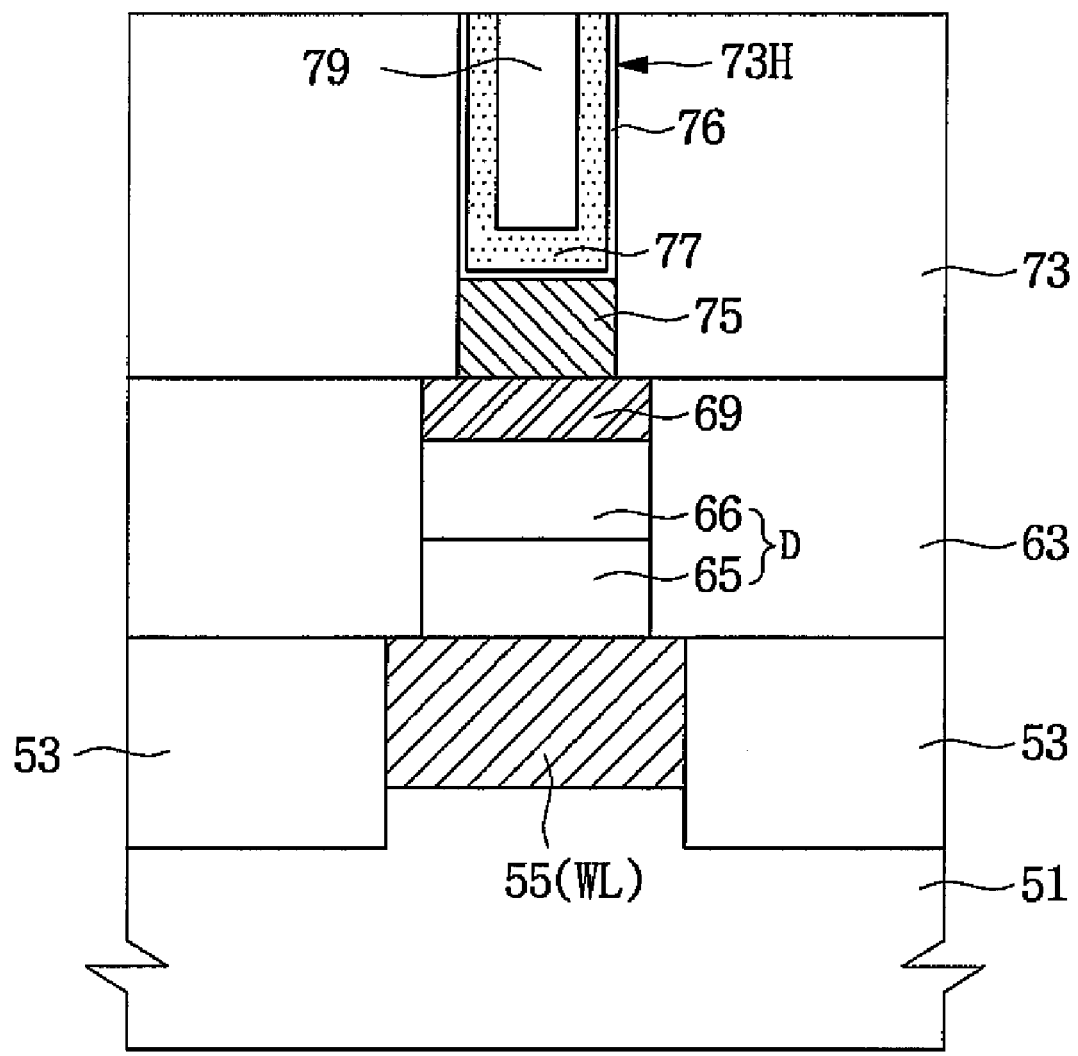

Referring to FIGS. 3 and 9, the resistant material layer 79L and the phase change layer 77L may be planarized to thereby form a resistant material pattern 79 and a phase change pattern 77. The planarization may be performed using a chemical mechanical polishing (CMP) process employing the interlayer insulating layer 73 as a stop layer. Alternatively, the planarization may be performed using an etch-back process. While the phase change pattern 77 and the resistant material pattern 79 are formed, the seed layer 76 may be partially removed. In this case, the seed layer 76 may remain in the contact hole 73H.

As a result, an upper end part of the phase change pattern 77 may have a doughnut shape when viewed from the top view. The upper end part of the phase change pattern 77 may be formed to a constant thickness along the sidewalls of the contact hole 73H. In this case, sidewalls and bottom of the resistant material pattern 79 may be surrounded by the phase change pattern 77. Furthermore, sidewalls and bottom of the phase change pattern 77 may be surrounded by the seed layer 76. In an exemplary embodiment, the upper end part of the phase change pattern 77 may occupy 1% to 99% of the diameter of the contact hole 73H.

Figure 10:
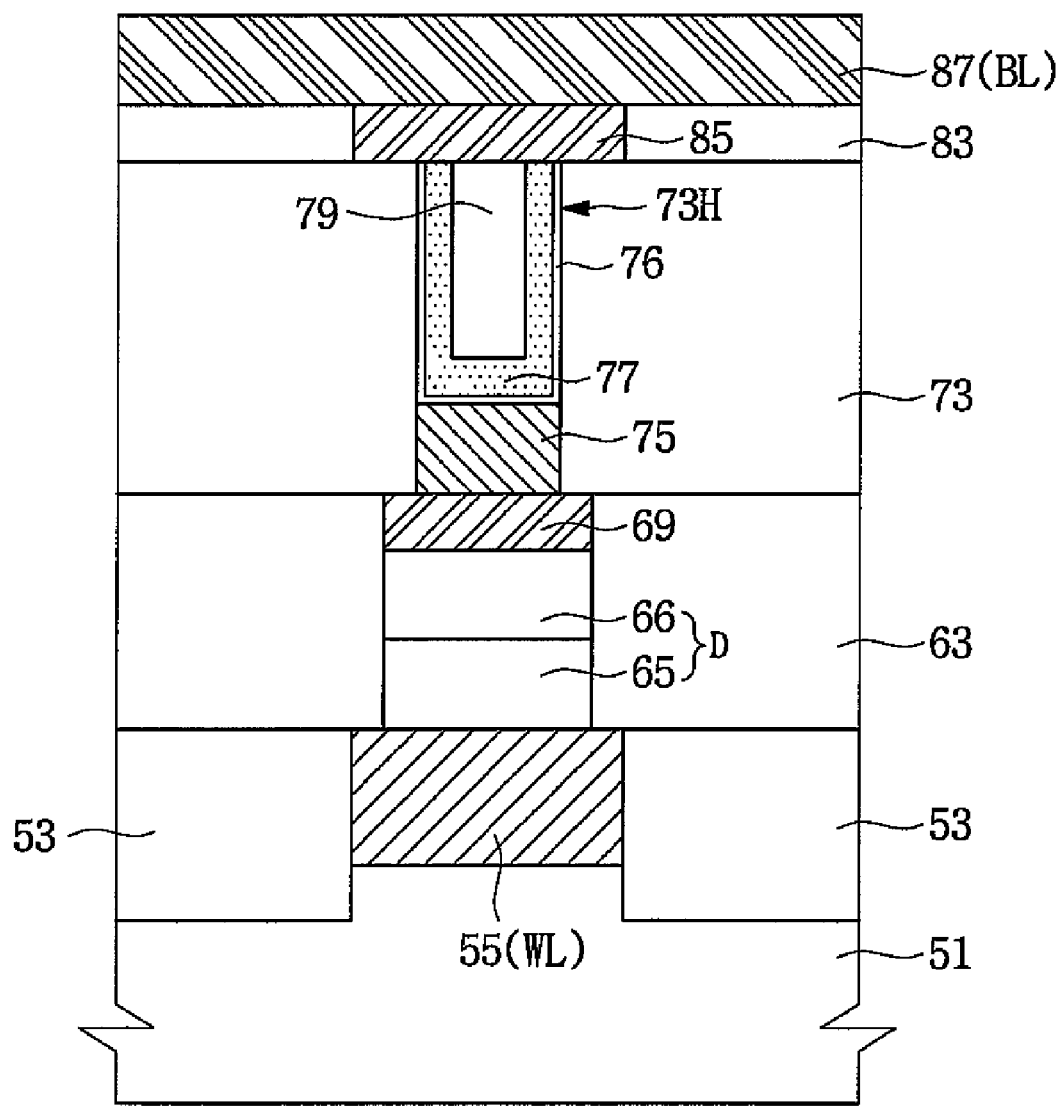

Referring to FIGS. 3 and 10, an upper insulating layer 83 covering the interlayer insulating layer 73 may be formed. The upper insulating layer 83 may be formed of an insulating layer as, for example, a silicon oxide layer, a silicon nitride layer, a silicon oxynitride layer, or a combination thereof.

An upper electrode 85 in contact with the phase change pattern 77 may be formed in the upper insulating layer 83. In particular, the upper electrode 85 may be formed to cover the contact hole 73H. Furthermore, a bit line 87 crossing the upper electrode 85 may be formed on the upper insulating layer 83.

The upper electrode 85 may be formed of a material from a group including a Ti layer, a TiN layer, a TiAlN layer, a W layer, a WN layer, a Si layer, a Ta layer, a TaN layer, a TaCN layer, and a WCN layer. The bit line 87 may be formed of a conductive layer such as a metal layer, a polysilicon layer, a metal silicide layer or a combination thereof.

The bit line 87 may be electrically connected to the word line 55 through the upper electrode 85, the phase change pattern 77, the lower electrode 75, the diode electrode 69, and the diode D. In addition, when the seed layer 76 is interposed between the phase change pattern 77 and the lower electrode 75, a tunneling current may flow between the phase change pattern 77 and the lower electrode 75 through the seed layer 76.

Figure 11:
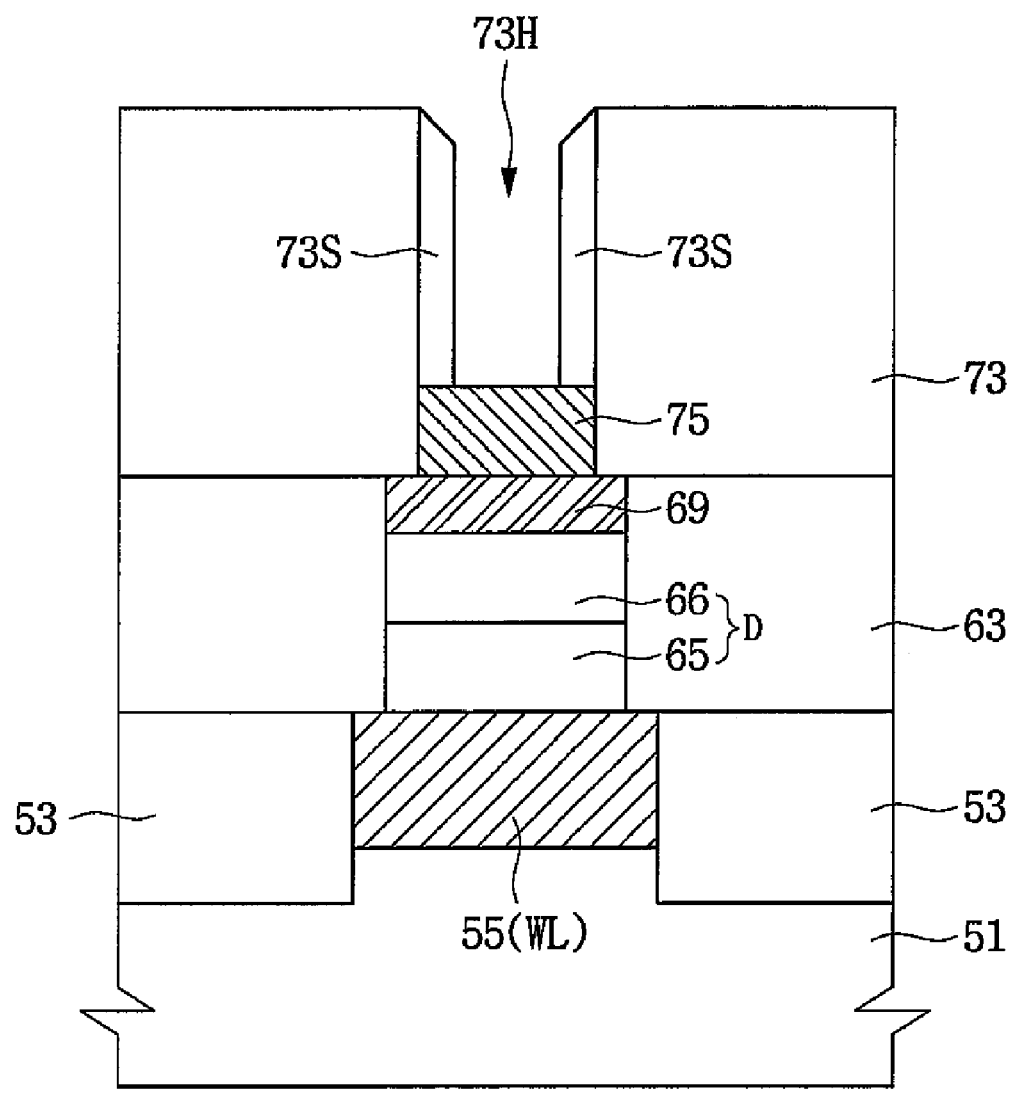
FIGS. 11 to 13 are cross-sectional views taken along line I-I' of FIG. 3, illustrating a method of fabricating the phase change memory device according to an alternative exemplary disclosed embodiment.
Figure 12:
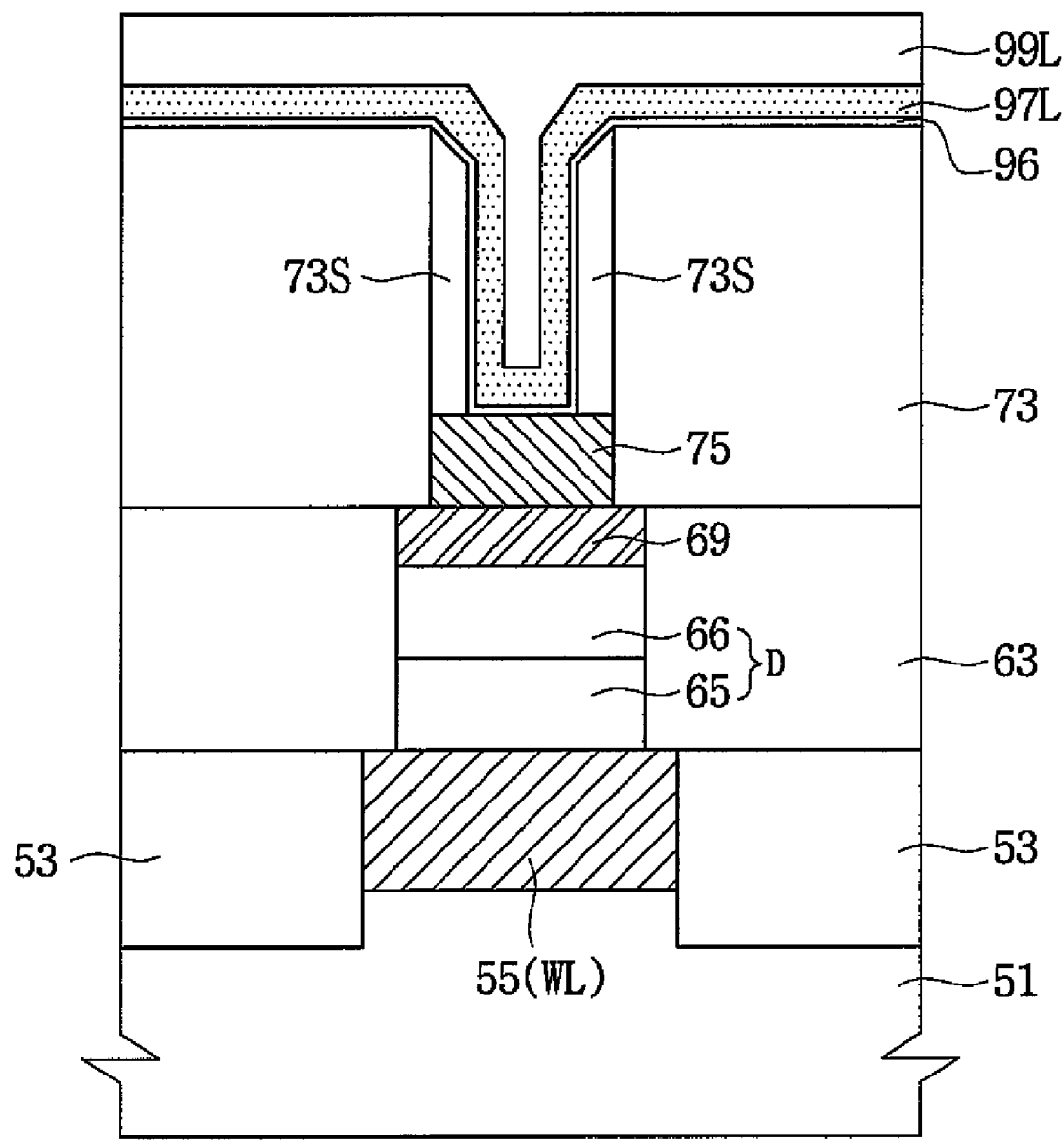
Figure 13:
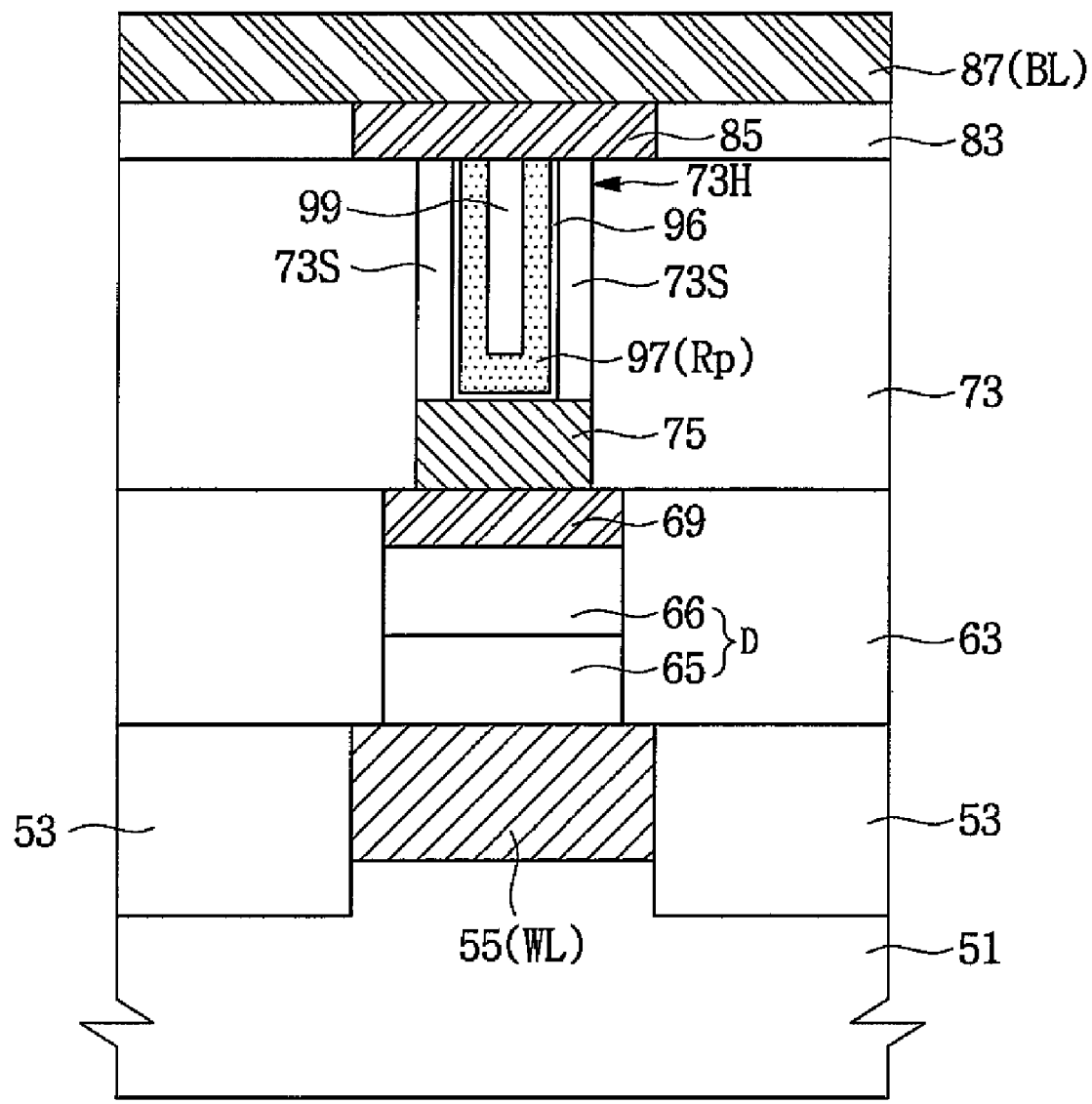

FIGS. 11 to 13 are cross-sectional views taken along line I-I' of FIG. 3, illustrating a method of fabricating the phase change memory device according to an alternative exemplary embodiment.

Referring to FIGS. 3 and 11, a world line 55, an isolation layer 53, a lower insulating layer 63, a diode D, a diode electrode 69, an interlayer insulating layer 73, a contact hole 73H, and a lower electrode 75 may be formed on a substrate 51 as described with reference to FIGS. 6 and 7. Therefore, only the differing steps will be described below.

Insulating spacers 73S may be formed on sidewalls of the contact hole 73H. The insulating spacer 73S may be formed of an insulating layer such as, for example, a silicon oxide layer, a silicon nitride layer, a silicon oxynitride layer, or a combination thereof. The insulating spacer 73S may be formed by forming the insulating layer on the substrate 51 having the lower electrode 75 and then anisotropically etching the insulating layer until the lower electrode 75 is exposed.

In this case, the insulating spacers 73S may be formed at an upper level of the lower electrode 75. Furthermore, the insulating spacer 73S may cover the sidewalls of the contact hole 73H.

Referring to FIGS. 3 and 12, a seed layer 96, a phase change layer 97L, and a resistant material layer 99L may be sequentially stacked on the substrate 51 having the lower electrode 75 and the insulating spacers 73S. In an exemplary embodiment, the seed layer 96, the phase change layer 97L, and the resistant material layer 99L may be formed by an in-situ process. In this case, the seed layer 96 and the resistant material layer 99L may be formed of the same material layer.

The seed layer 96 may be formed to cover the lower electrode 75, the insulating spacers 73S, and the interlayer insulating layer 73. Furthermore, the seed layer 96 may support the uniform formation of the phase change layer 97L. Moreover, the seed layer 96 may be formed to a relatively smaller thickness than the phase change layer 97L. In an exemplary embodiment, the seed layer 96 may be formed of a material from a group including TiO, ZrO, MgO, NiO, GeO, SbO and TeO. Alternatively, the seed layer 96 may be omitted altogether.

The phase change layer 97L may be formed on the seed layer 96. The phase change layer 97L may be formed of a material from a first material group including Ge—Sb—Te, Ge—Bi—Te, Ge—Te—As, Ge—Te—Sn, Ge—Te, Ge—Te—Sn—O, Ge—Te—Sn—Au, Ge—Te—Sn—Pd, Ge—Te—Se, Ge—Te—Ti, Ge—Sb, (Ge, Sn)—Sb—Te, Ge—Sb—(SeTe), Ge—Sb—In, and Ge—Sb—Te—S. The phase change layer 97L may also be formed of a compound in which the one selected from the first material group is doped with a material selected from a second material group including N, O, Bi, Sn, B and Si.

The resistant material layer 99L may be formed on the phase change layer 97L in order to fill a remaining portion of the contact hole 73H. The resistant material layer 99L may be formed of a material layer having a higher resistance than the phase change layer 97L. Also, the resistant material layer 99L may be formed of a dielectric layer. In addition, the resistant material layer 99L may be formed of a material from a group including TiO, ZrO, MgO, NiO, GeO, SbO, TeO, $SiO_2$, SiN, and SiON.

Referring to FIGS. 3 and 13, the resistant material layer 99L and the phase change layer 97L may be planarized to thereby form a resistant material pattern 99 and a phase change pattern 97. The planarization may be performed using a CMP process employing the interlayer insulating layer 73 as a stop layer. Alternatively, an etch-back process may be employed for the planarization. While the phase change pattern 97 and the resistant material pattern 99 are formed, the seed layer 96 may be partially removed. In this case, the seed layer 96 may remain in the contact hole 73H.

As a result, an upper end part of the phase change pattern 97 may have a doughnut shape when viewed from the top view. Furthermore, the upper end part of the phase change pattern 97 may be formed to a constant thickness along the sidewalls of the contact hole 73H. In this case, sidewalls and the bottom of the resistant material pattern 99 may be surrounded by the phase change pattern 97. Furthermore, sidewalls and bottom of the phase change pattern 97 may be surrounded by the seed layer 96. Additionally, the sidewalls of the seed layer 96 may be surrounded by the insulating spacers 73S. In an exemplary embodiment, the upper end part of the phase change pattern 97 may occupy 1% to 99% of the diameter of the contact hole 73H.

An upper insulating layer 83 covering the interlayer insulating layer 73 may be formed. The upper insulating layer 83 may be formed of an insulating layer such as, for example, a silicon oxide layer, a silicon nitride layer, a silicon oxynitride layer, or a combination thereof.

An upper electrode 85 in contact with the phase change pattern 97 may be formed in the upper insulating layer 83. Furthermore, the upper electrode 85 may be formed to cover the contact hole 73H. In addition, a bit line 87 crossing the upper electrode 85 may be formed on the upper insulating layer 83.

The bit line 87 may be electrically connected to the word line 55 through the upper electrode 85, the phase change pattern 97, the lower electrode 75, the diode electrode 69, and the diode D. Furthermore, when the seed layer 96 is interposed between the phase change pattern 97 and the lower electrode 75, a tunneling current may flow between the phase change pattern 97 and the lower electrode 75 through the seed layer 96.

As described above, a phase change pattern is provided in a contact hole interposed between a lower electrode and an upper electrode. The contact hole is filled with a resistant material pattern having a higher resistance than the phase change pattern. The phase change pattern is disposed to surround the sidewalls and bottom of the resistant material pattern. The upper electrode is electrically connected to the lower electrode through the phase change pattern. Furthermore, a lower end part of the phase change pattern in contact with the lower electrode may have a larger cross-sectional area than the phase change pattern surrounding the sidewalls of the resistant material pattern. Accordingly, a transition volume may be formed in a region spaced from the lower electrode by a predetermined distance. In other words, the transition volume may have a relatively smaller cross-sectional area than the lower end part of the phase change pattern. Consequently, a current required to convert the transition volume into a crystalline or amorphous state may be considerably reduced compared to the conventional art.

Exemplary embodiments of the present disclosure have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A phase change memory device, comprising:
a lower electrode provided on a substrate;
an interlayer insulating layer including a contact hole exposing the lower electrode, and covering the substrate;
a resistant material pattern filling the contact hole;
a phase change pattern interposed between the resistant material pattern and the interlayer insulating layer, and extending between the resistant material pattern and the lower electrode, wherein the resistant material pattern has a higher resistance than the phase change pattern;
an upper electrode in contact with the phase change pattern, the upper electrode being electrically connected to the lower electrode through the phase change pattern; and
a seed layer interposed between the phase change pattern and the interlayer insulating layer, and extending between the phase change pattern and the lower electrode.

2. The phase change memory device of claim 1, wherein the resistant material pattern is formed of a material including at least one of TiO, ZrO, MgO, NiO, GeO, SbO, TeO, $SiO_2$, SiN, and SiON.

3. The phase change memory device of claim 1, wherein the seed layer is formed of a material including at least one of TiO, ZrO, MgO, NiO, GeO, SbO, and TeO.

4. The phase change memory device of claim 3, wherein the seed layer is formed of a same material as the resistant material pattern.

5. The phase change memory device of claim 1, wherein an upper end part of the phase change pattern occupies 1% to 99% of a diameter of the contact hole, both inclusive.

6. The phase change memory device of claim 1, wherein a region where the phase change pattern overlaps the lower electrode has a same size as a top surface of the lower electrode.

7. The phase change memory device of claim 1, wherein the lower electrode and the contact hole are of the same diameter.

8. A phase change memory device, comprising:
a lower electrode provided on a substrate;
an interlayer insulating layer including a contact hole exposing the lower electrode, and covering the substrate;
a resistant material pattern filling the contact hole;
a phase change pattern interposed between the resistant material pattern and the interlayer insulating layer, and extending between the resistant material pattern and the lower electrode, wherein the resistant material pattern has a higher resistance than the phase change pattern;
an upper electrode in contact with the phase change pattern, the upper electrode being electrically connected to the lower electrode through the phase change pattern; and
an insulating spacer interposed between the phase change pattern and the interlayer insulating layer.

9. The phase change memory device of claim 8, wherein a region where the phase change pattern overlaps the lower electrode is smaller than a top surface of the lower electrode.

* * * * *